(12) United States Patent
Hatano et al.

(10) Patent No.: US 6,559,509 B1
(45) Date of Patent: May 6, 2003

(54) SEMICONDUCTOR DEVICE PROTECTION CIRCUIT WHOSE OPERATION IS STABILIZED

(75) Inventors: Keisuke Hatano, Tokyo (JP); Yasutaka Nakashiba, Tokyo (JP)

(73) Assignee: NEC Corporation, Tokyo (JP)

(*) Notice: Subject to any disclaimer, the term of this patent is extended or adjusted under 35 U.S.C. 154(b) by 198 days.

(21) Appl. No.: 09/651,103

(22) Filed: Aug. 30, 2000

(30) Foreign Application Priority Data

Sep. 7, 1999  (JP) .......................................... 11-252828

(51) Int. Cl.[7] .......................................... H01L 21/8238
(52) U.S. Cl. ........................................ 257/362
(58) Field of Search .......................................... 257/362

(56) References Cited

U.S. PATENT DOCUMENTS

| | | | | |
|---|---|---|---|---|
| 5,122,855 | A | * | 6/1992 | Shirai |
| 5,329,143 | A | * | 7/1994 | Chan et al. |
| 5,449,940 | A | * | 9/1995 | Hirata |
| 5,473,169 | A | * | 12/1995 | Ker et al. |
| 5,721,445 | A | * | 2/1998 | Singh et al. |
| 5,747,834 | A | * | 5/1998 | Chen et al. |
| 5,843,813 | A | * | 12/1998 | Wei et al. |
| 6,125,021 | A | * | 9/2000 | Duvvury et al. |
| 6,169,309 | B1 | * | 1/2001 | Teggatz et al. |
| 6,172,404 | B1 | * | 1/2001 | Chen et al. |
| 6,175,139 | B1 | * | 1/2001 | Horiguchi et al. |
| 6,194,764 | B1 | * | 2/2001 | Gossner et al. |
| 6,353,247 | B1 | * | 3/2002 | Pan |

FOREIGN PATENT DOCUMENTS

| | | |
|---|---|---|
| JP | 63-86477 | 4/1988 |
| JP | 6-21076 | 1/1994 |
| JP | 8-195442 | 7/1996 |
| JP | 10-163433 | 6/1998 |
| JP | 10-261764 | 9/1998 |

* cited by examiner

Primary Examiner—George Fourson
Assistant Examiner—Joannie Adelle Garcia
(74) Attorney, Agent, or Firm—Sughrue Mion, PLLC

(57) ABSTRACT

A semiconductor device protection circuit is composed of a first semiconductor portion of a first conductive type, a second semiconductor portion of a second conductive type connected to the first semiconductor portion, a third semiconductor portion of the first conductive type connect to the second semiconductor portion, and fourth and fifth semiconductor portions of the second conductive type, both connected to the second semiconductor portion. The first conductive portion is connected to a semiconductor circuit which is to be protected from electrostatic breakdown. The third, fourth, and fifth semiconductor portions are short-circuited. The fourth and fifth semiconductor portions are located at opposite sides of the third semiconductor portion.

7 Claims, 18 Drawing Sheets

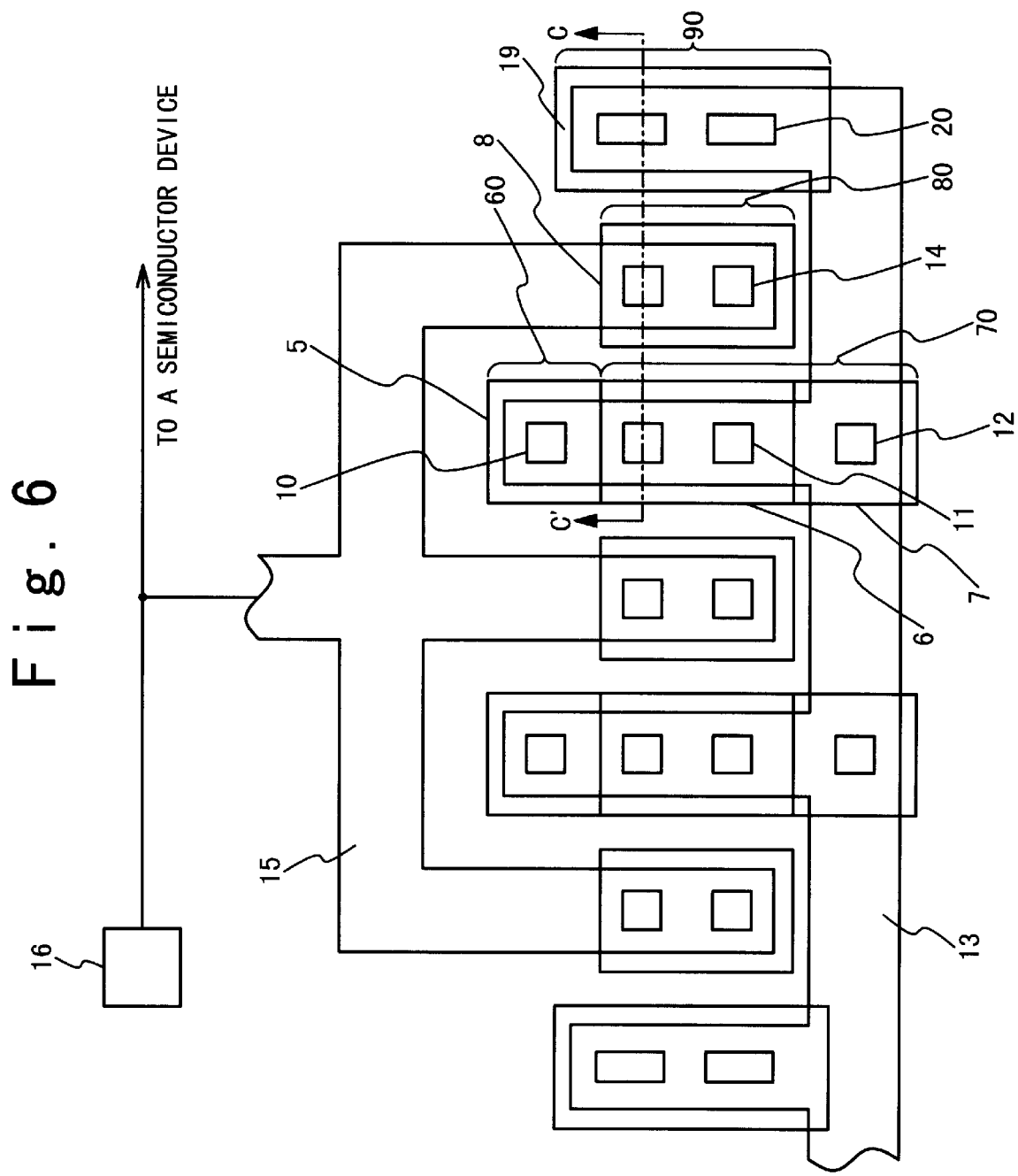

SEMICONDUCTOR DEVICE PROTECTION CIRCUIT WHOSE OPERATION IS STABILIZED

BACKGROUND OF THE INVENTION

1. Field of the Invention

The present invention relates to a semiconductor device protection circuit. More particularly, the present invention relates to a semiconductor device protection containing a parasitic bipolar transistor.

2. Description of the Related Art

A protection circuit is widely used to avoid a semiconductor device from being damaged because of noise or static electricity.

FIG. 1 is a plan view illustrating a conventional protection circuit, which contains a parasitic NPN bipolar transistor.

FIGS. 2A and 2B are sectional views showing the structure of the protection circuit.

FIG. 2A shows the structure of a section along a D–D' line in FIG. 1, and FIG. 2B shows the structure of a section along an E–E' line in FIG. 1.

A P-well 102 is formed in the surface portion of an N-type semiconductor substrate 101. Active areas 600, 700 and 800 are formed in the P-well 102. The active areas 600, 700 and 800 are separated by a field oxide film 103 formed in the surface portion of the P-well 102. A channel stop 104 is formed immediately beneath the field oxide film 103. The channel stop 104 is a heavily-doped P-type semiconductor.

As shown in FIG. 2A, a P+ region 105 is formed in the active area 600. The P+ region 105 is a heavily-doped P-type semiconductor. The P+ region 105 is connected to the channel stop 104.

An N+ region 106 is formed in the active area 700. The N+ region 106 is a heavily-doped N-type semiconductor. The N+ region 106 is connected to the channel stop 104.

The field oxide film 103, the P+region 105 and the N+ region 106 are covered by an insulation film 108. Contacts 109, 110 are formed through the insulation film 108. The P+ region 105 and the N+ region 106 are short-circuited to each other by a metallic wiring 111 through the contacts 109, 110.

On the other hand, an N+ region 107 is formed in the active area 800, as shown in FIG. 2B. The N+ region 107 is connected to the channel stop 104. The N+ region 107 is covered by the insulation film 108. Moreover, a contact 112 is formed through the insulation film 108. The N+ region 107 is connected through the contact 112 to a metallic wiring 113. The metallic wiring 113 is connected to an external connection terminal 114 and a semiconductor device (not shown), as shown in FIG. 1.

The channel stop 104, the P+ region 105, the N+ region 106 and the N+ region 107 constitute a parasitic transistor, as shown in FIGS. 2A and 2B. The channel stop 104 functions as a P-type base of the parasitic transistor. The P+ region 105 functions as a heavily-doped P-type semiconductor for giving a potential to the base. The N+ region 106 functions as an emitter of the parasitic transistor. And, the N+ region 107 functions as a collector of the parasitic transistor.

The operations of the conventional protection circuit will be described below.

The metallic wiring 111 is grounded, and the P+ region 105 and the N+ region 106 are fixed to a ground potential. Moreover, a predetermined potential is given to the N-type semiconductor substrate 101.

If an excessive voltage is applied to the external connection terminal 114, the potential of the N+ region 107 is largely increased. At this time, as shown in FIG. 2A, a reverse bias is applied to a PN junction 115 composed of the channel stop 104 and the N+ region 107. That is, the reverse bias is applied to a base-collector junction of the parasitic bipolar transistor. When the reverse bias becomes equal to or higher than a breakdown voltage, the PN junction 115 is broken down. If the PN junction 115 is broken down, a reverse bias current flows through the PN junction 115. The reverse bias current flows through the channel stop 104 and the N+ region 106 into the metallic wiring 111.

At this time, a potential drop resulting from a resistive component of the channel stop 104 causes a forward bias to be applied to a PN junction 116 composed of the N+ region 106 and the channel stop 104. That is, the forward bias is applied to the base-emitter junction of the parasitic bipolar transistor.

As a result, the parasitic bipolar transistor amplifies the reverse bias current. Charges accumulated in the metallic wiring 113 quickly flow into the metallic wiring 111. Thus, the potential of the metallic wiring 113 is quickly dropped to thereby protect the semiconductor device connected to the metallic wiring 113.

Japanese Laid Open Patent Applications (JP-A-Heisei, 6-21076, 8-195442, and 10-163433) disclose other protection circuits for carrying out the similar operation.

It is desirable that the operation of such a protection circuit is stable. If light is incident on the P-well 102 and the channel stop 104, electrons are generated in the P-well 102 and the channel stop 104. The generation of the electrons causes the potential of the channel stop 104 to be easily varied. This results in an easy variation of a voltage at which the PN junction 115 composed of the channel stop 104 and the N+ region 107 is broken down. In the worst case, there may be a possibility that the operation of the conventional protection circuit is unstable to thereby bring about an optical latch-up. Hence, it is desirable that the operation of the protection circuit is stable even if the light is incident on the P-well 102 and the channel stop 104.

SUMMARY OF THE INVENTION

Therefore, an object of the present invention is to surely fix to a ground level a potential of a base of a protection circuit containing a parasitic bipolar transistor.

Another object of the present invention is to enable a stable operation of a protection circuit of a semiconductor device containing a parasitic bipolar transistor.

Still another object of the present invention is to protect an optical latch-up of a protection circuit of a semiconductor device containing a parasitic bipolar transistor.

In order to achieve an aspect of the present invention, a semiconductor device protection circuit is composed of a first semiconductor portion of a first conductive type, a second semiconductor portion of a second conductive type which is connected to the first semiconductor portion, a third semiconductor portion of the first conductive type which is connected to the second semiconductor portion, and fourth and fifth semiconductor portions of the second conductive type, both connected to the second semiconductor portion. The first conductive portion is connected to a semiconductor device which is to be protected from electrostatic breakdown. The third, fourth, and fifth semiconductor portions are short-circuited. The fourth and fifth semiconductor portions are located at opposite sides of the third semiconductor portion.

In the semiconductor device protection circuit of the present invention, the fourth and fifth semiconductor portions are located on both sides of the third semiconductor portion, which results in the stable potential of the second conductive portion. Thus, this stabilizes the operation of the semiconductor device protection circuit according to the present invention.

The third and fourth semiconductor portions may be substantially in contact with each other. In addition, the third and fifth semiconductor portions may be substantially in contact with each other.

When the third and fourth semiconductor portions are in contact with each other, a distance between the third and fourth semiconductor portions is the shortest, which results in the stable operation of the semiconductor device protection circuit of the present invention. Also, When the third and fifth semiconductor portions are in contact with each other, a distance between the third and fifth semiconductor portions is the shortest, which results in the stable operation of the semiconductor device protection circuit of the present invention.

The third, fourth, and fifth semiconductor portions may be earthed.

The semiconductor device protection circuit may further include a field oxide film formed on the second semiconductor portion. In this case, the first and the third semiconductor portions are separated by the field oxide.

The second semiconductor portion may be a channel stop.

The first and second semiconductor portions form a PN junction. A first breakdown voltage of the PN junction is desirably smaller than a second breakdown voltage of the semiconductor device.

In order to achieve another aspect of the present invention, a method of fabricating a semiconductor device protection circuit include:

forming a first semiconductor portion of a first conductive type;

forming a second semiconductor portion of a second conductive type, connected to the first semiconductor portion;

forming a third semiconductor portion of the first conductive type, connected to the second semiconductor portion;

forming fourth semiconductor portion of the second conductive type, connected to the second semiconductor portion; and forming fifth semiconductor portion of the second conductive type, connected to the second semiconductor portion. The first conductive portion is connected to a semiconductor circuit which is to be protected from electrostatic breakdown. The third, fourth, and fifth semiconductor portions are short-circuited. The fourth and fifth semiconductor portions are located at opposite sides of the third semiconductor portion.

The first and third semiconductor portions are desirably formed at a same time.

The fourth and fifth semiconductor portions are desirably formed at a same time.

The method may further include forming a earthing conductor. In this case, the third, fourth, and fifth semiconductor portions are connected to the earthing conductor.

BRIEF DESCRIPTION OF THE DRAWINGS

FIG. 6 is a plan view showing another structure of a protection circuit of the first embodiment.

DESCRIPTION OF THE PREFERRED EMBODIMENTS

A semiconductor device protection circuit according to the present invention will be described below with reference to the attached drawings.

Figure 1:
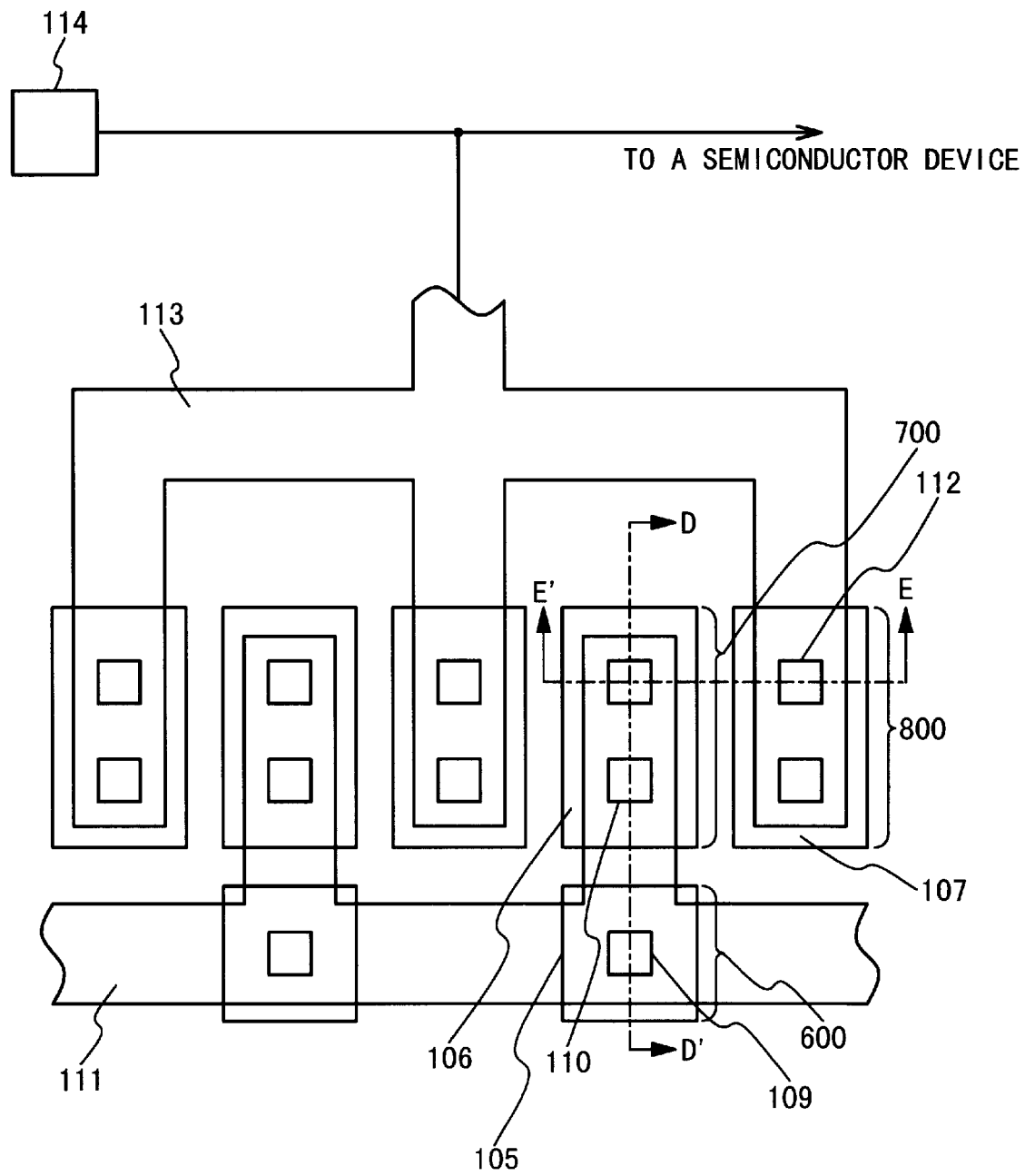
FIG. 1 is a plan view showing a structure of a conventional protection circuit.
Figure 2A:
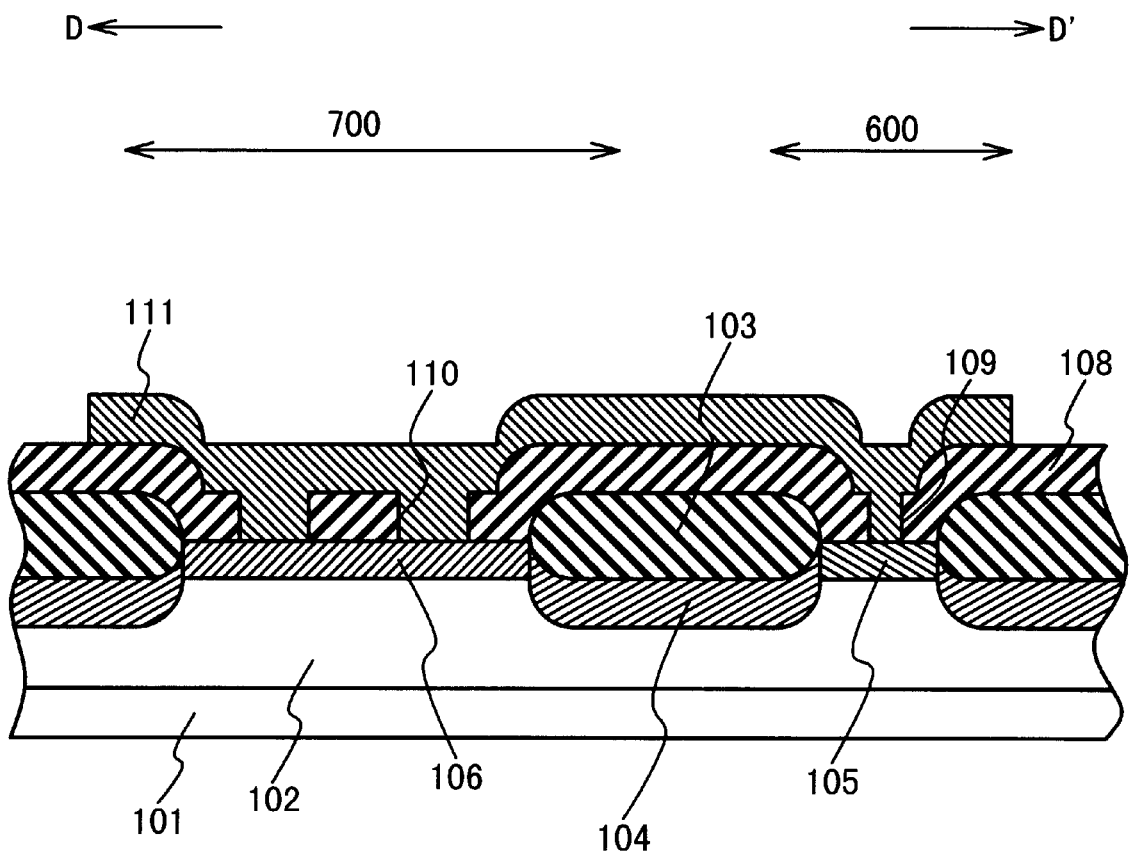
FIG. 2A is a sectional view showing the structure of the conventional protection circuit.
Figure 2B:
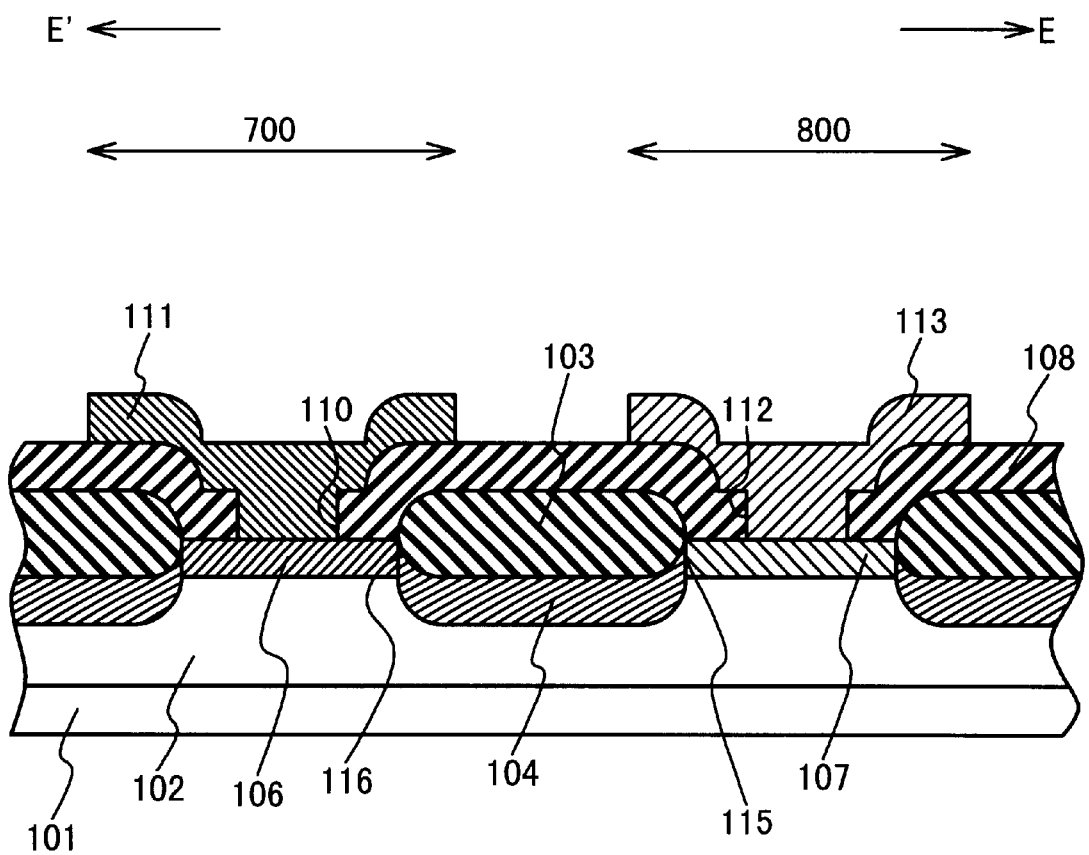
FIG. 2B is a sectional view showing the structure of the conventional protection circuit.
Figure 3:
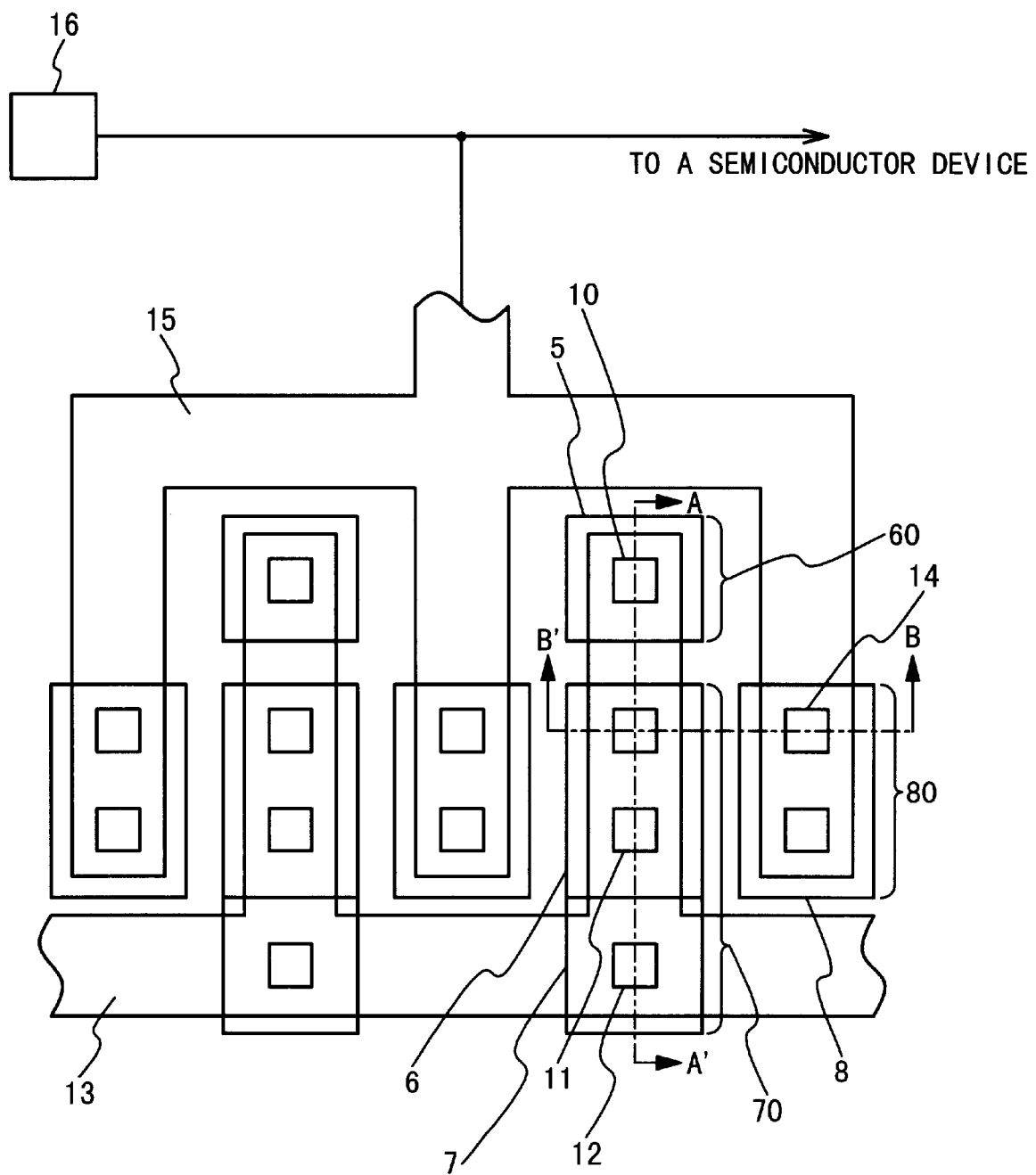
FIG. 3 is a plan view showing a structure of a protection circuit in a first embodiment of the present invention.

FIG. 3 is a plan view showing a structure of a protection circuit in a first embodiment of the present invention. The protection circuit contains a parasitic NPN bipolar transistor.

Figure 4A:
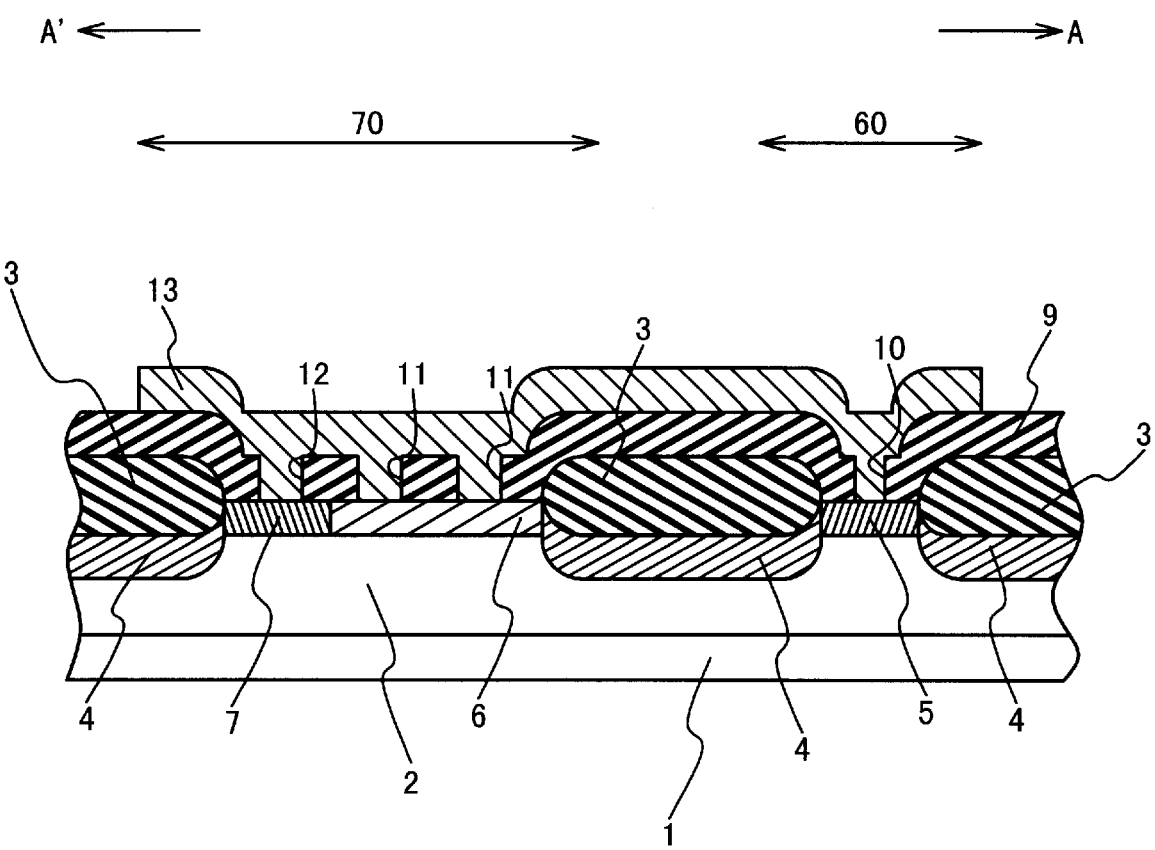
FIG. 4A is a sectional view showing the structure of the protection circuit of the first embodiment.
Figure 4B:
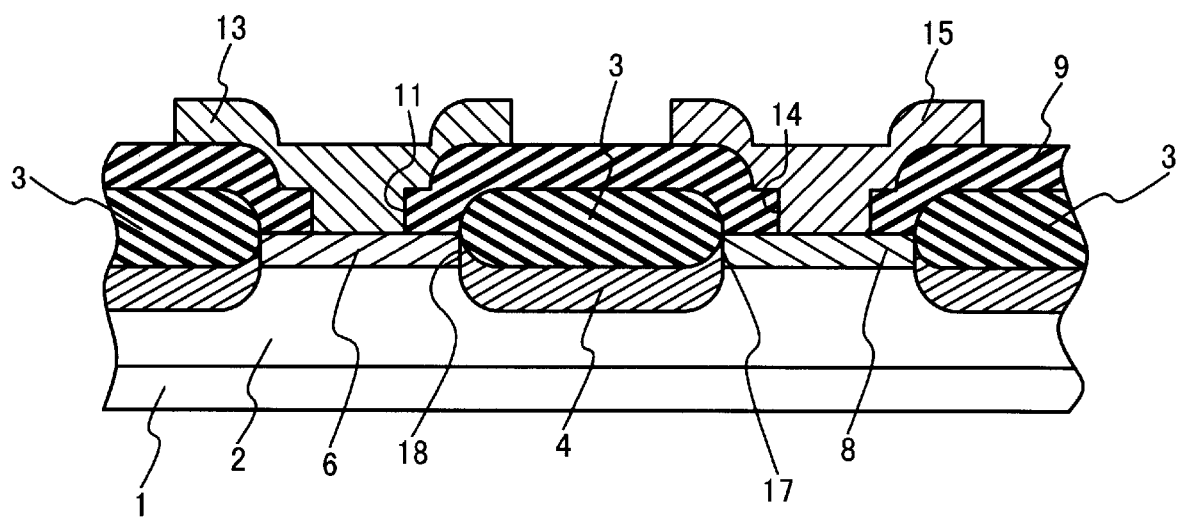
FIG. 4B is a sectional view showing the structure of the protection circuit of the first embodiment.

FIG. 4A shows the structure of a section along a cut line A–A' in FIG. 3. FIG. 4B shows the structure of a section along a cut line B–B' in FIG. 3. The protection circuit include an N-type semiconductor substrate 1. A P-well 2 is formed in the surface portion of the N-type semiconductor substrate 1. Active areas 60, 70 are formed in the P-well 2, as shown in FIG. 4A. Moreover, an active area 80 is formed in the P-well 2, as shown in FIG. 4B.

The active areas 60, 70 and 80 are separated by a field oxide film 3 formed in the P-well 2. A channel stop 4 is formed immediately beneath the field oxide film 3. The channel stop 4 is a heavily-doped P-type semiconductor.

As shown in FIG. 4A, a P+ region 5 is formed in the active area 60. The P+ region 5 is a heavily-doped P-type semiconductor. The P+ region 5 is connected to the channel stop 4.

An N+ region 6 is formed in the active area 70. The N+ region 6 is a heavily-doped N-type semiconductor. The N+ region 6 is connected to the channel stop 4.

Moreover, a P+ region 7 is formed in the active area 70. The P+ region 7 is a heavily-doped P-type semiconductor. The P+ region 7 is connected to the channel stop 4.

The P+ region 7 is substantially connected to the N+ region 6. The fact of the junction between the P+ region 7 and the N+ region 6 enables the stable operation in the protection circuit, as described later.

On the other hand, an N+ region 8 is formed in the active area 80, as shown in FIG. 4B. The N+ region 8 is a heavily-doped N-type semiconductor. The N+ region 8 is connected to the channel stop 4.

The field oxide film 3, the P+ region 5, the N+ region 6, the P+ region 7 and the N+ region 8 are covered by an insulation film 9, as shown in FIGS. 4A and 4B. Contacts 10, 11 and 12 are formed through the insulation film 9, as shown in FIG. 4A. The P+ region 5, the N+ region 6 and the P+ region 7 are short-circuited to each other by a metallic wiring 13 through the contacts 10, 11 and 12.

On the other hand, a contact 14 reaching the N+ region 8 is further formed in the insulation film 9, as shown in FIG. 4B. The N+ region 8 is connected through the contact 14 to a metallic wiring 15. The metallic wiring 15 is connected to an external connection terminal 16 and a semiconductor device (not shown).

Figure 5A:
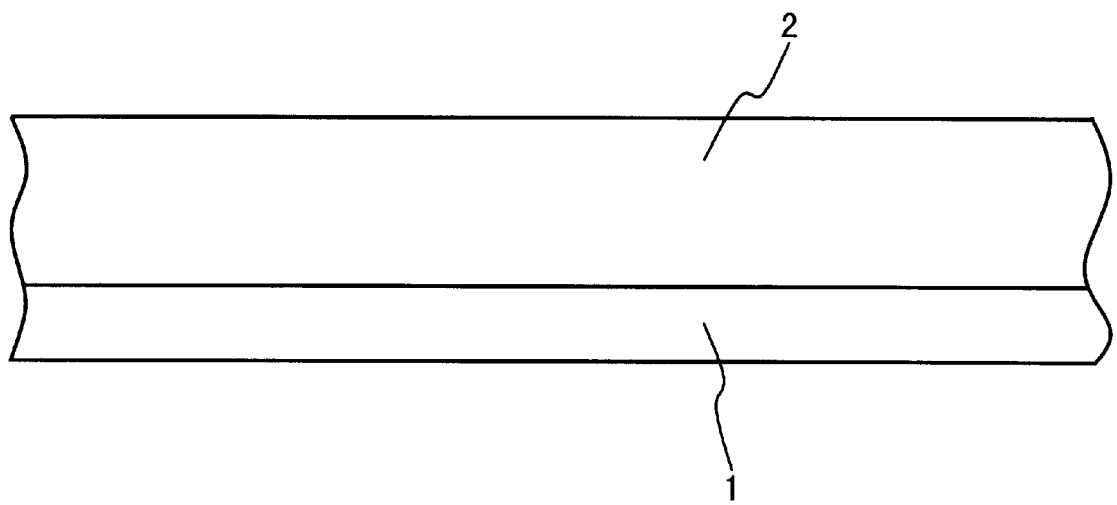
FIG. 5A is a sectional view showing a manufacturing method in the first embodiment.

A method for manufacturing a protection circuit in the first embodiment is described in the following. FIGS. 5A to 5H show the method for manufacturing the protection circuit. At first, the P-well 2 is formed in the N-type semiconductor substrate 1, as shown in FIG. 5A.

Figure 5B:
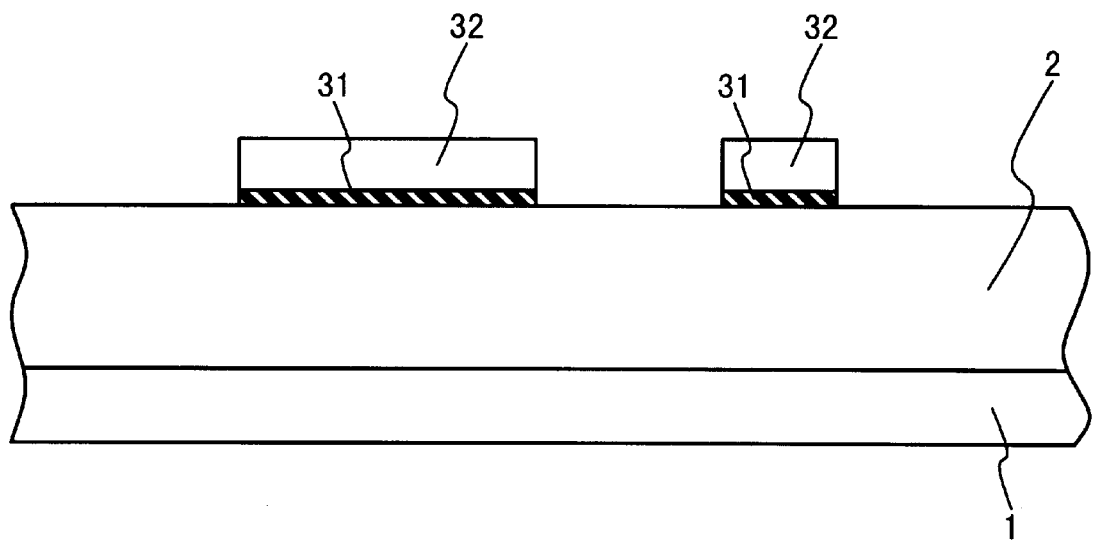
FIG. 5B is a sectional view showing the manufacturing method in the first embodiment.

Next, as shown in FIG. 5B, the surface of the P-well 2 is selectively coated with an oxidation resistance mask 31 and a resist mask 32. At this time, a region in which the field oxide film 3 is formed by subsequent processes is exposed.

Figure 5C:
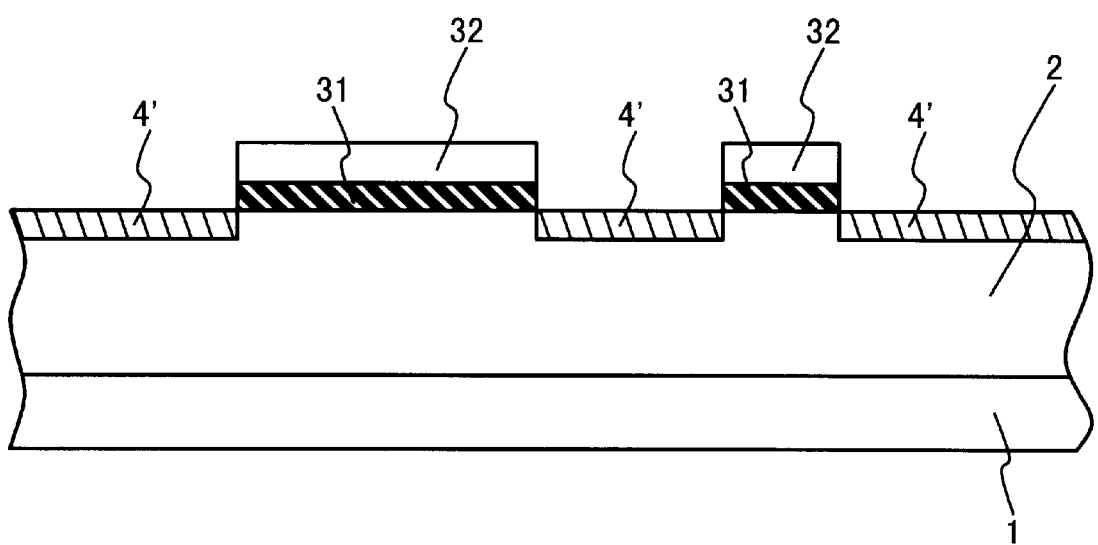
FIG. 5C is a sectional view showing the manufacturing method in the first embodiment.

As shown in FIG. 5C, a P-type impurity is implanted into the exposed region. The P-type impurity is boron. This results in the formation of a P+ region 4'. The P+ region 4' is changed into the channel stop 4 by subsequent processes.

Figure 5D:
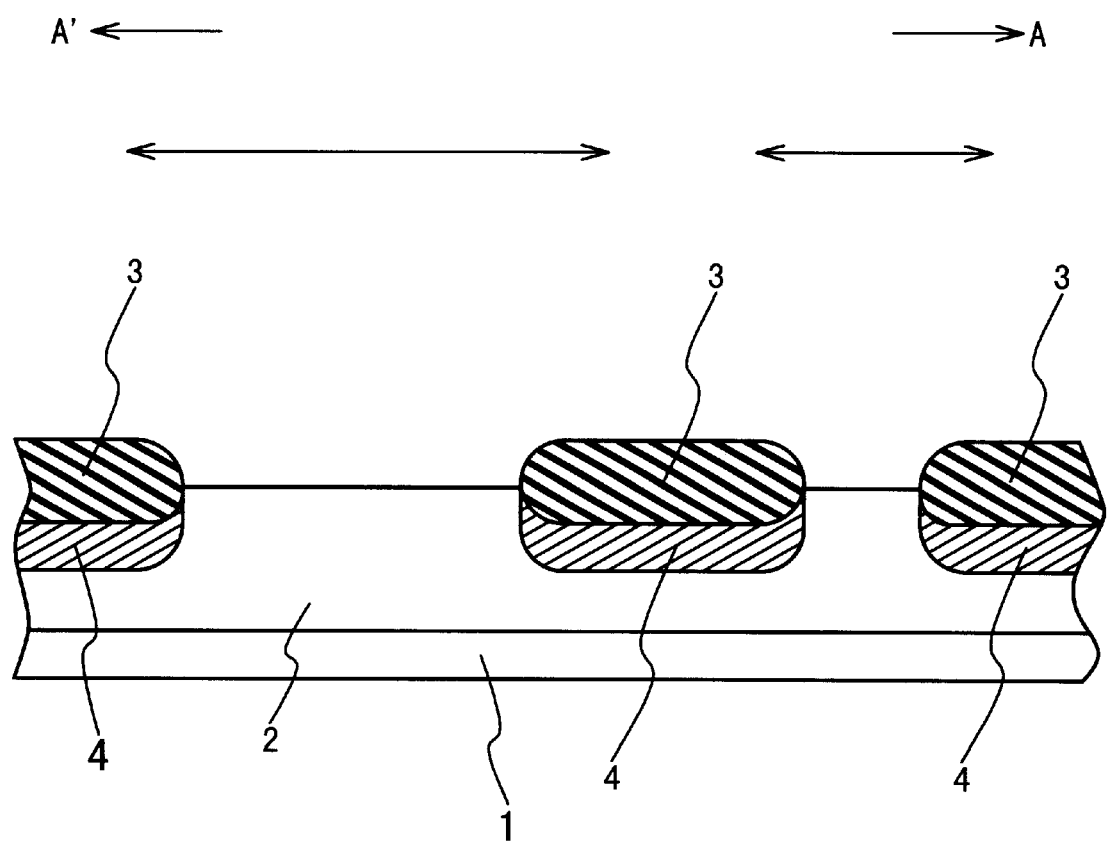
FIG. 5D is a sectional view showing the manufacturing method in the first embodiment.

After the removal of the resist mask 32, an annealing operation is carried out in high temperature oxidation atmosphere, as shown in FIG. 5D. The field oxide film 3 is formed in the exposed region, which is not coated with the oxidation resistance mask 31. Moreover, the channel stop 4 is formed immediately beneath the field oxide film 3.

Next, the oxidation resistance mask 31 is removed.

The above-mentioned processes enable the P-well 2 to be partitioned by the field oxide film 3 so that the active areas 60, 70 and 80 are formed.

Next, P-type and N-type impurities are selectively implanted into the active areas 60, 70 and 80 to thereby form the P+ region 5, the N+ region 6, the P+ region 7 and the N+ region 8.

Figure 5E:
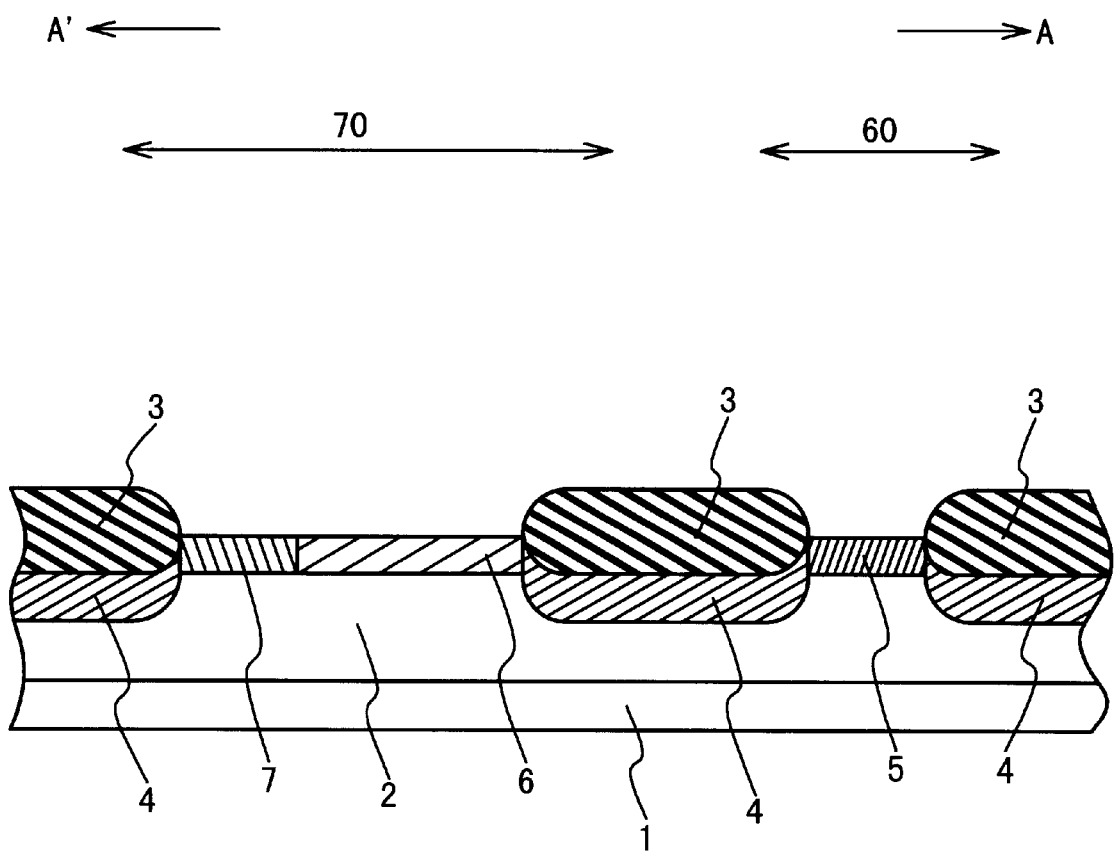
FIG. 5E is a sectional view showing the manufacturing method in the first embodiment.

As shown in FIG. 5E, the P+ region 5 is formed in the active area 60. The P-type impurities are heavily-doped in the P+ region 5.

The N+ region 6 and the P+ region 7 are formed in the active area 70. The N-type impurities are heavily-doped in the N+ region 6. The P-type impurities are heavily-doped in the P+ region 7. The N+ region 6 and the P+ region 7 are adjacent to each other. The N+ region 6 and the P+ region 7 are substantially in contact with each other.

Figure 5F:
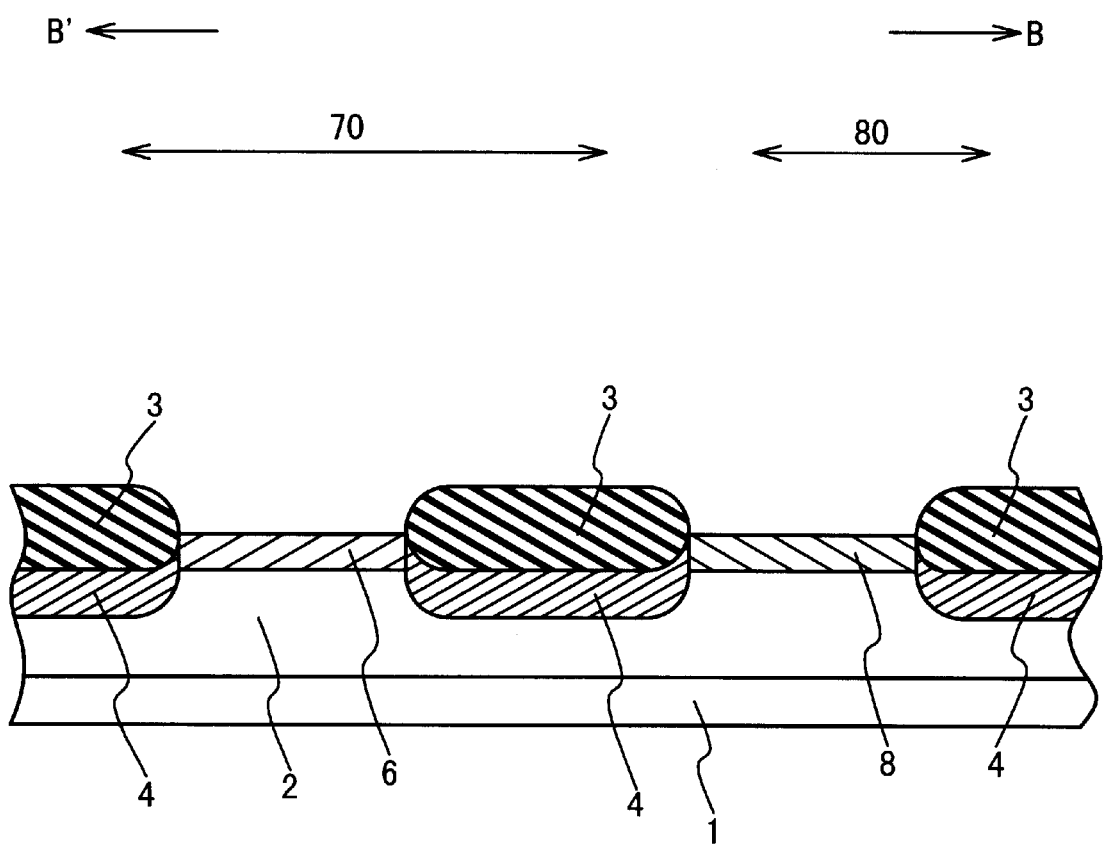
FIG. 5F is a sectional view showing the manufacturing method in the first embodiment.

The N+ region 8 is formed in the active area 80, as shown in FIG. 5F. The N-type impurities are heavily-doped in the N+ region 8.

The P+ region 5 and the P+ region 7 are formed at the same time. The N+ region 6 and the N+ region 8 are formed at the same time.

Figure 5G:
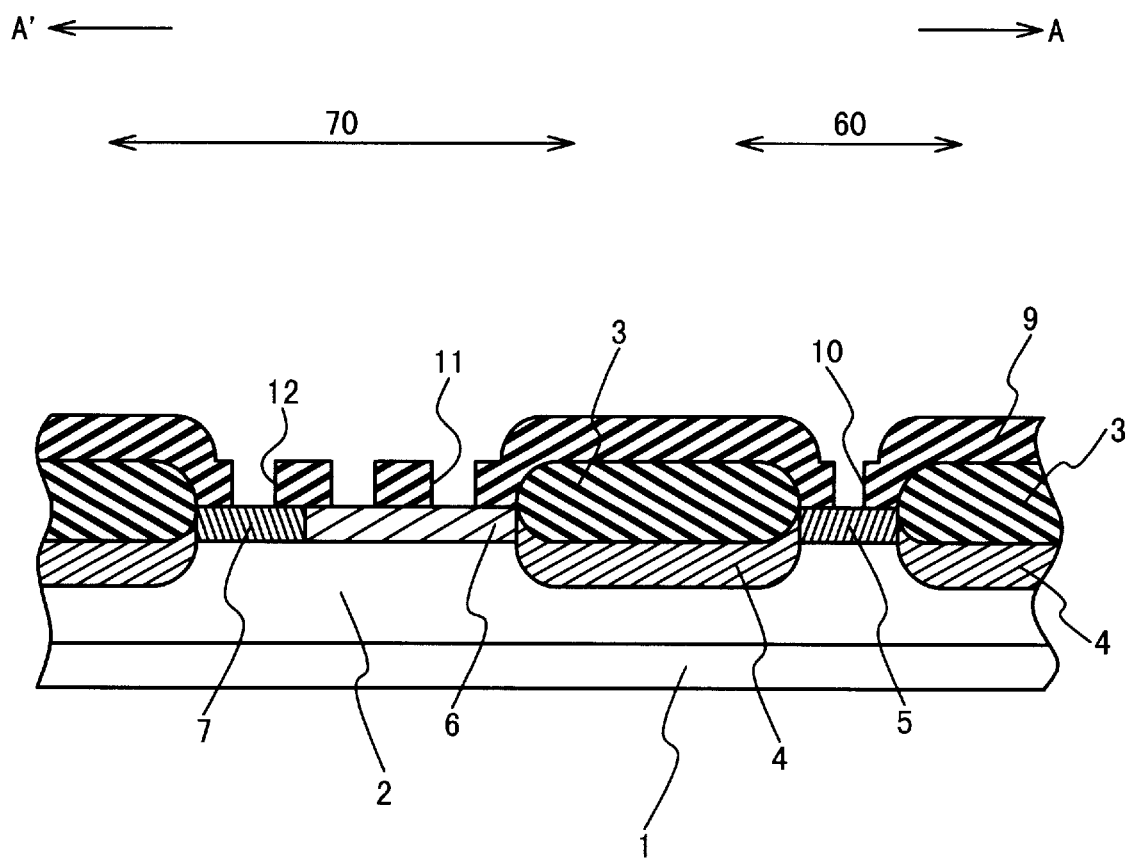
FIG. 5G is a sectional view showing the manufacturing method in the first embodiment.
Figure 5H:
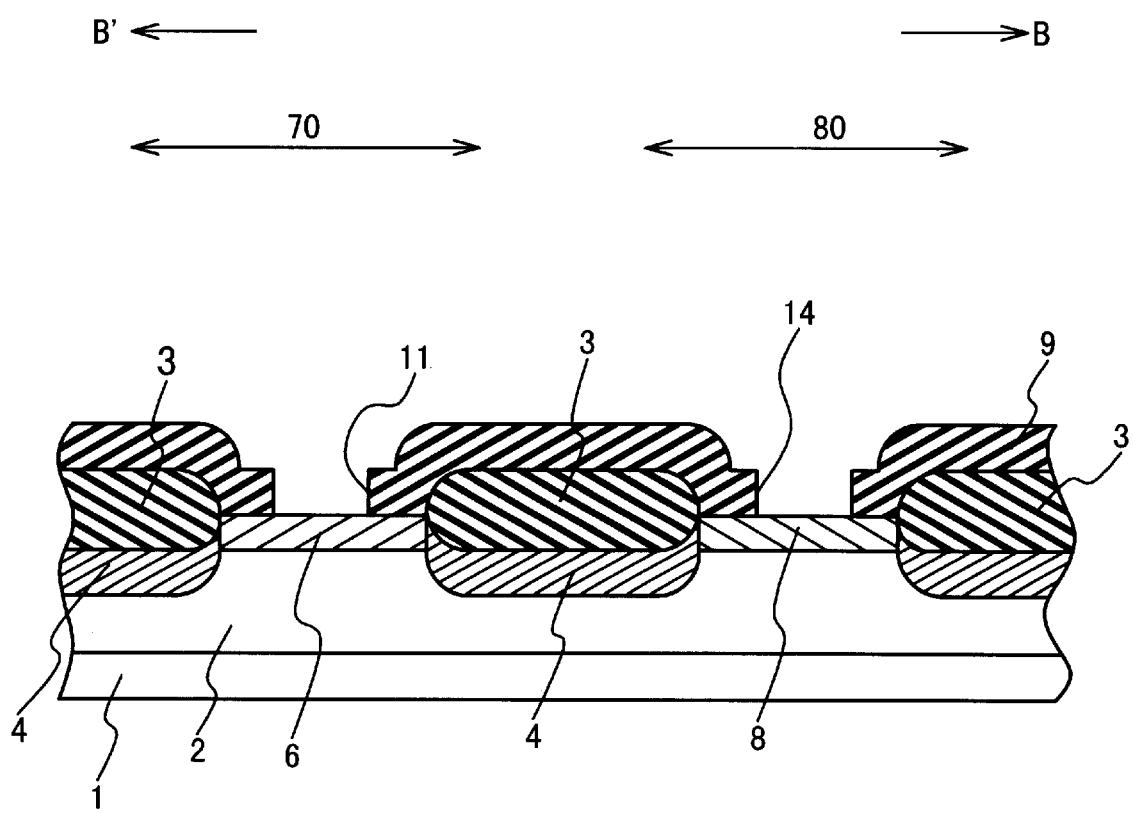
FIG. 5H is a sectional view showing the manufacturing method in the first embodiment.
Figure 7:
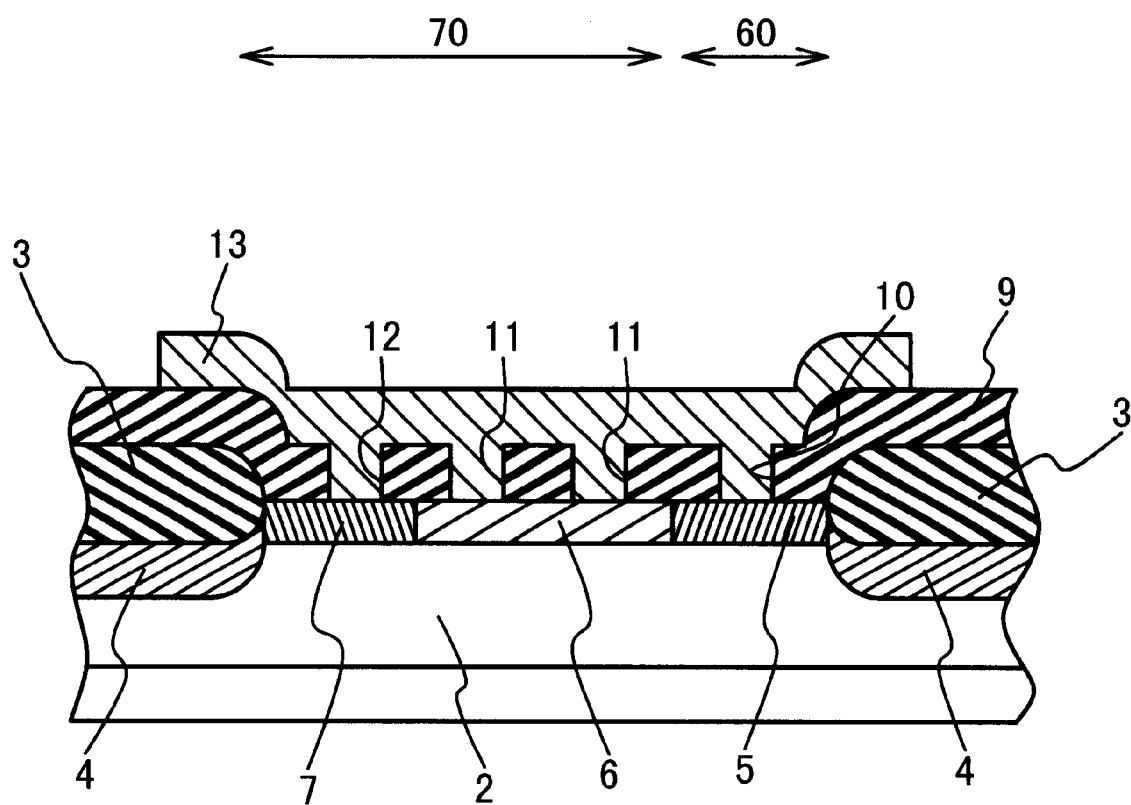
FIG. 7 is a sectional view showing the other structure of a protection circuit of the first embodiment.

The insulation film 9 (not shown) is formed for covering the P+ region 5, the N+ region 6, the P+ region 7 and the N+ region 8. Then, the contacts 10, 11, 12 and 14 are formed in the insulation film 9, as shown in FIGS. 5G and 5H.

Next, the metallic wirings 13, 15 are formed, and the process for manufacturing the protection circuit is ended.

The operations of the protection circuit in the first embodiment is described in succession.

The channel stop 4, the P+ region 5, the N+ region 6, the P+ region 7 and the N+ region 8 constitute the protection circuit containing the parasitic bipolar transistor, as shown in FIGS. 4A and 4B. The channel stop 4 functions as a p-type base of the parasitic transistor. The P+ region 5 and the P+ region 7 give a potential to the base. The N+ region 6 functions as an emitter of the parasitic transistor. And, the N+ region 8 functions as a collector of the parasitic transistor.

If the protection circuit is used, the metallic wiring 13 is grounded. The P+ region 5, the N+ region 6 and the P+ region 7 are fixed to a ground potential. Moreover, a predetermined potential is given to the N-type semiconductor substrate 1.

If an excessive voltage is applied to the external connection terminal 16, the potentials of the metallic wiring 15 and the N+ region 8 are largely increased. At this time, as shown in FIG. 4B, a reverse bias is applied to a PN junction 17 composed of the channel stop 4 and the N+ region 8. That is, the reverse bias is applied to a base-collector junction of the parasitic bipolar transistor. A breakdown voltage of the PN junction 17 is smaller than a second breakdown voltage of the semiconductor device which is connected to the metallic wiring 15. When the reverse bias becomes equal to or higher than a breakdown voltage of the PN junction 17, the PN junction 17 is broken down. If the PN junction 17 is broken down, a reverse bias current flows through the PN junction 17. The reverse bias current flows through the channel stop 4 and the N+ region 6 into the metallic wiring 13.

At this time, a potential drop resulting from a resistive component of the channel stop 4 causes a forward bias to be applied to a PN junction 18 composed of the N+ region 6 and the channel stop 4. That is, the forward bias is applied to the base-emitter junction of the parasitic bipolar transistor.

As a result, the parasitic bipolar transistor carries out the operation for amplifying the reverse bias current. Charges accumulated in the metallic wiring 15 quickly flow into the metallic wiring 13. Thus, the potential of the metallic wiring 15 is quickly dropped to thereby protect the semiconductor device connected to the metallic wiring 15.

In the protection circuit of the first embodiment, the P+ region 5 and the P+ region 7 are positioned on both sides of the N+ region 6 to thereby stabilize the potential of the channel stop 4. Thus, it is possible to stabilize the operation of the semiconductor device protection circuit according to the present invention.

At this time, the P+ region 7 for giving the potential to the base is positioned in contact with the N+ region 6 serving as the emitter of the parasitic bipolar transistor. A distance between the N+ region 6 and the P+ region 7 becomes the shortest. Thus, the potential of the channel stop 4 is surely fixed which serves as the base of the parasitic bipolar transistor. Hence, the variation of a voltage at which the PN junction 17 is broken down can be protected to thereby stabilize the operation of the protection circuit. Moreover, this makes the generation of the optical latch-up difficult.

In the first embodiment, the P+ region 5 may be positioned in contact with the N+ region 6, as shown in FIGS.

6 and 7. Accordingly, the potential of the channel stop 4 can be further surely fixed.

Also, in the first embodiment, the P+ region 7 may be positioned apart from the N+ region 6.

Moreover, the protection circuit in the first embodiment may contain a PNP parasitic bipolar transistor instead of the NPN parasitic bipolar transistor.

A protection circuit in a second embodiment of the present invention is described in succession.

Figure 8:
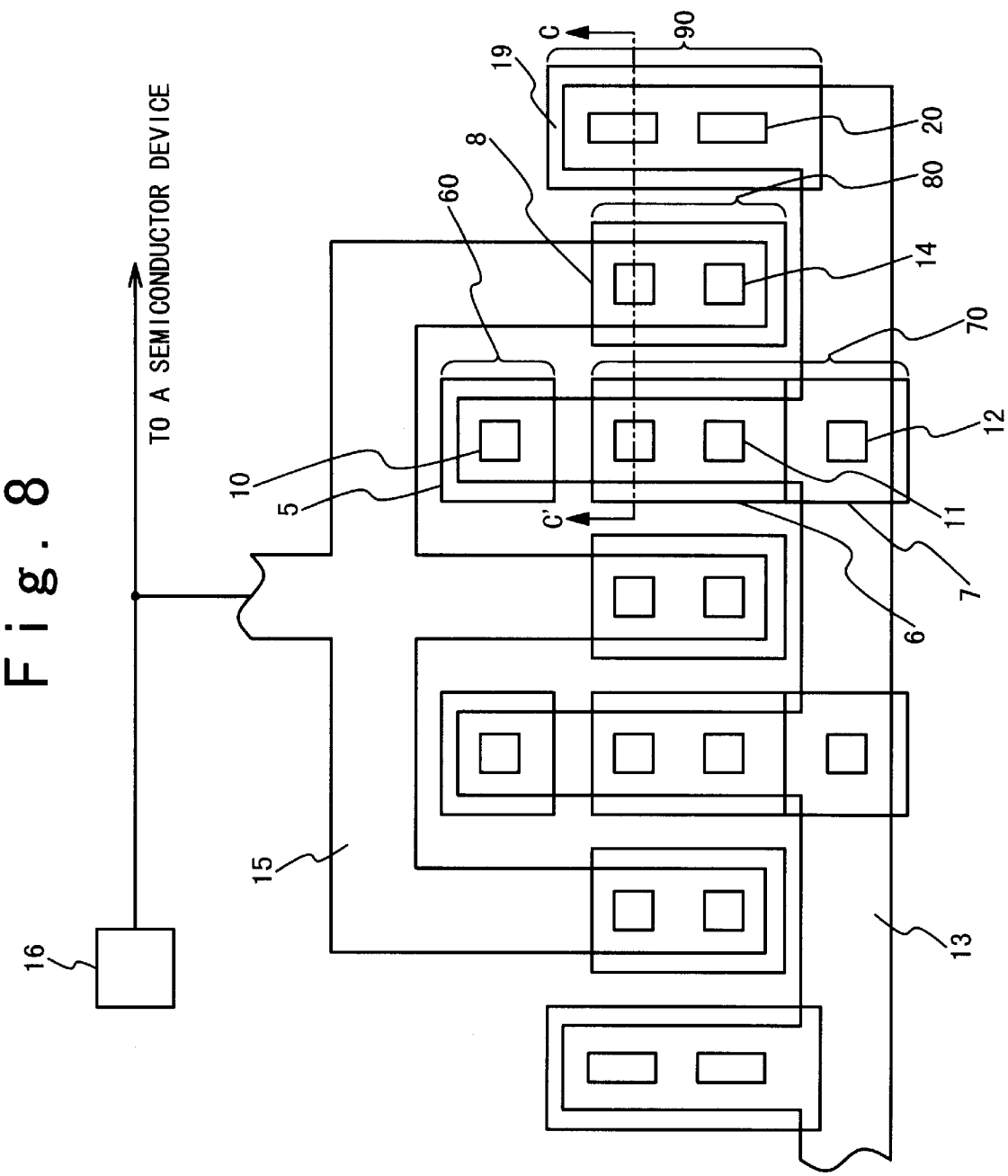
FIG. 8 is a plan view showing a structure of a protection circuit in a second embodiment of the present invention.
Figure 9:
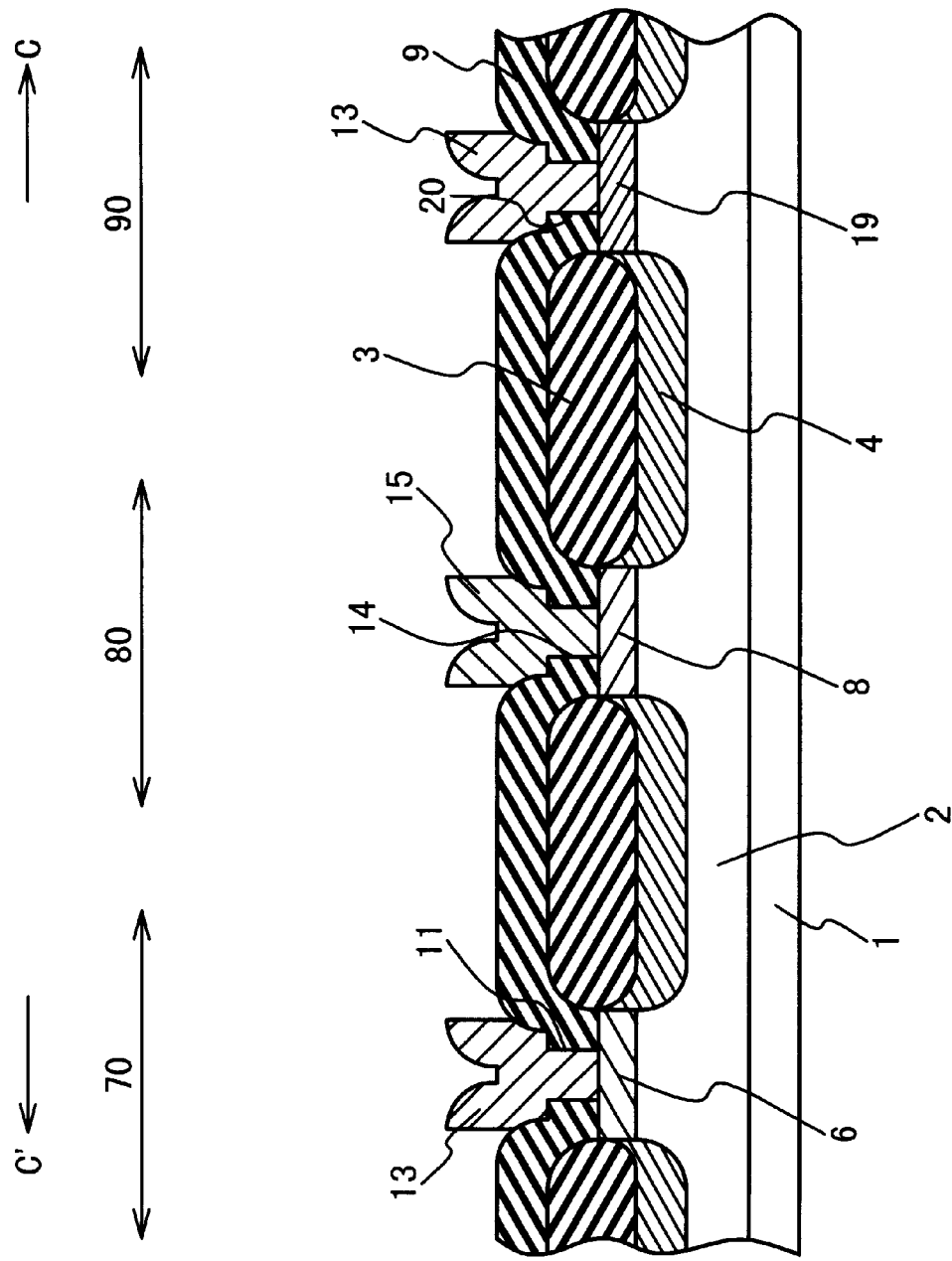
FIG. 9 is a sectional view showing the structure of the protection circuit in the second embodiment of the present invention.

FIG. 8 is a plan view showing the protection circuit in the second embodiment. FIG. 9 is a sectional view showing the structure of a section along a cut line C–C' in FIG. 6.

The protection circuit in the second embodiment has the structure similar to that of the protection circuit in the first embodiment. The protection circuit in the second embodiment is different from the protection circuit in the first embodiment in a fact that a P+ region 19 is further formed, in addition to the P+ regions 5, 7.

The P+ region 19 is formed in an active area 90 defined in the P-well 2. The P+ region 19 is separated from the N+ region 8 by the field oxide film 3. The P+ region 19 and the N+ region 6 are opposite to each other with the N+ region 8 between. The P+ region 19 is connected through a contact 20 to the metallic wiring 13. The configurations of the other portions are similar to those of the protection circuit in the first embodiment.

The operations of the protection circuit in the second embodiment are similar to those of the protection circuit in the first embodiment.

As mentioned above, the P+ region 19 is formed in the protection circuit in the second embodiment, in addition to the P+ regions 5, 7. The protection circuit in the second embodiment can fix the base potential stronger than that of the protection circuit in the first embodiment. Moreover, there are a plurality of routes through which the charges flow from the metallic wiring 15 into the metallic wiring 13. Thus, it is possible to protect the protection circuit from being damaged.

The protection circuit in the second embodiment may contain a PNP parasitic bipolar transistor instead of the NPN parasitic bipolar transistor.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor device protection circuit comprising:
   a first semiconductor portion of a first conductive type, wherein said first conductive portion is connected to a semiconductor device which is to be protected from electrostatic breakdown;
   a second semiconductor portion of a second conductive type, connected to said first semiconductor portion;
   a third semiconductor portion of said first conductive type, connected to said second semiconductor portion; and
   fourth and fifth semiconductor portions of said second conductive type, both connected to said second semiconductor portion, wherein said third, fourth, and fifth semiconductor portions are short-circuited, and said fourth and fifth semiconductor portions are located at opposite sides of said third semiconductor portion.

2. A semiconductor device protection circuit according to claim 1, wherein said third and fourth semiconductor portions are in contact with each other.

3. A semiconductor device protection circuit according to claim 2, wherein said third and fourth semiconductor portions are in contact with each other.

4. A semiconductor device protection circuit according to claim 1, wherein said third, fourth, and fifth semiconductor portions are earthed.

5. A semiconductor device protection circuit according to claim 1, further comprising a field oxide film formed on said second semiconductor portion, wherein said first and said third semiconductor portions are separated by said field oxide.

6. A semiconductor device protection circuit according to claim 5, wherein said second semiconductor portion is a channel stop.

7. A semiconductor device protection circuit according to claim 1, wherein said first and second semiconductor portions form a PN junction, and a first breakdown voltage of said PN junction is smaller than a second breakdown voltage of said semiconductor device.

* * * * *